(12) United States Patent
Shiang

(10) Patent No.: US 7,389,927 B2
(45) Date of Patent: Jun. 24, 2008

(54) AUTOMATICALLY MARKING AND READING/DISTINGUISHING APPARATUS AND METHOD OF USE

(75) Inventor: Chien Yueh Shiang, Bade (TW)

(73) Assignee: All Fine Technology Co., Ltd., Taoyuan County (TW)

( * ) Notice: Subject to any disclaimer, the term of this patent is extended or adjusted under 35 U.S.C. 154(b) by 237 days.

(21) Appl. No.: 11/248,212

(22) Filed: Oct. 13, 2005

(65) Prior Publication Data

US 2006/0172569 A1 Aug. 3, 2006

(30) Foreign Application Priority Data

Jan. 31, 2005 (TW) .............................. 94102954 A

(51) Int. Cl.
*G06K 7/10* (2006.01)
(52) U.S. Cl. .................................. 235/462.01; 235/470
(58) Field of Classification Search ................. 235/454, 235/470, 462.13, 462.01
See application file for complete search history.

(56) References Cited

U.S. PATENT DOCUMENTS

| | | | | |
|---|---|---|---|---|
| 3,409,129 A | * | 11/1968 | Sperry ........................ 209/3.3 |
| 5,003,251 A | * | 3/1991 | Fuoco ........................ 324/764 |
| 5,025,597 A | * | 6/1991 | Tada et al. ..................... 451/75 |
| 5,619,416 A | * | 4/1997 | Kosarew ...................... 700/225 |
| 6,198,525 B1 | * | 3/2001 | Barringer et al. .............. 355/23 |
| 6,246,251 B1 | * | 6/2001 | Gallagher .................... 324/765 |
| 6,279,901 B1 | | 8/2001 | Fulmer |
| 2004/0156028 A1 | * | 8/2004 | Okada ......................... 355/53 |
| 2006/0118631 A1 | * | 6/2006 | Lubow et al. .......... 235/462.01 |

FOREIGN PATENT DOCUMENTS

CN 2563644 Y 7/2003

\* cited by examiner

*Primary Examiner*—Michael G. Lee
*Assistant Examiner*—Paultep Savusdiphol
(74) *Attorney, Agent, or Firm*—Birch, Stewart, Kolsach & Birch, LLP

(57) ABSTRACT

An automatically marking, reading and distinguishing apparatus, which programmingly controls a conveyance of a printed circuit board, includes a table, an information label generator, at least one flipping device, and an image reading and distinguishing device. The table includes a first area and a second area. The information label generator is disposed corresponding to the first area for generating and labeling an information label on the printed circuit board. The image reading and distinguishing device is disposed corresponding to the second area to determine whether the information label is readable. The flipping device is located under the table and has a rotating part and at least one set of jigs for flipping the labeled or readable printed circuit boards.

20 Claims, 10 Drawing Sheets

| | | |
|---|---|---|
| 1. | 001 L<br>A | |
| 2. | 001 L<br>B | |
| 3. | 001<br>A | |
| 4. | 002 L<br>A | 001 R<br>A |
| 5. | 002 L<br>B | 001 R<br>B |
| 6. | 002<br>A | 001<br>A |
| 7. | 003 L<br>A | 002 R<br>A |
| 8. | 003 L<br>B | 002 R<br>B |
| 9. | 003<br>A | 002<br>A |
| 10. | 004 L<br>A | 003 R<br>A |

Fig. 10

AUTOMATICALLY MARKING AND READING/DISTINGUISHING APPARATUS AND METHOD OF USE

This application claims priority based on a Taiwanese patent application No. 094102954 filed on Jan. 31, 2005.

BACKGROUND OF THE INVENTION

1. Field of the Invention

The present invention relates generally to an automatically marking, reading and distinguishing apparatus. Particularly, the present invention relates to an automatically marking, reading and distinguishing apparatus for marking, reading, and distinguishing a printed circuit board.

2. Description of the Relative Art

Quality control is an important issue for the printed circuit board manufacture process. During the manufacture, each connection between the element and the printed circuit board has to be checked one by one. In order to trace the printed circuit board during the manufacture process and afterward, a bar code is printed or attached on the printed circuit board. Once any piece of printed circuit board has problem, the whole manufacture process information may be traced through the bar code.

Taiwanese Patent Publication No. 536104 dated on Jul. 15, 2002 discloses a base 1, a main holder 2, a marking system 3 and a computer 5. The marking system 3 further comprises a laser bar code printer 6 and a bar code reader 4 having a charge coupled device (CCD) which is disposed on the main holder 2. As FIG. 1 shows, the relative art device positions a printed circuit board 7 and uses the computer 5 to control a transmission device 8 to adjust the position of the printed circuit board 7. The relative device may handle only single printed circuit board and single side at one time. In addition, the relative art device gives a warning, shuts down the process, and manually marks the defective printed circuit board.

SUMMARY OF THE INVENTION

It is an object of the present invention to provide an apparatus and a method for generating an information label, reading and distinguishing the information label on a printed circuit board, and confirming the information labels are distinguishable. It is another object of the present invention to provide an apparatus for retrieving the printed circuit boards having undistinguishable information labels.

It is another object of the present invention to provide an apparatus for generating, reading, and distinguishing information labels on both sides of a printed circuit board. The printed circuit board mentioned here includes a double-sided board or a multi-layer board.

The present invention achieves these and other objectives by providing an automatically marking, reading and distinguishing apparatus, which programmingly controls a conveyance of a printed circuit board. The apparatus includes a table, an information label generator, at least one flipping device, and an image reading and distinguishing device. The table includes a first area and a second area. The information label generator is disposed corresponding to the first area for generating an information label on the printed circuit board. The flipping device is located under the table and has a rotating part and at least one set of jigs. The image reading and distinguishing device is disposed corresponding to the second area for reading and distinguishing the information label on the printed circuit board.

Particularly, in order to label and read the back side of the printed circuit board, the flipping device includes a cylinder, which drives the set of jigs to rotate the printed circuit board for 180 degree.

The present invention also provides a method for automatically marking, reading and distinguishing a printed circuit board. The method includes: conveying a printed circuit board to a table; positioning the printed circuit board in a first area of the table and generating an information label on the printed circuit board; positioning the printed circuit board in a second area of the table and reading/distinguishing the information label on the printed circuit board; flipping the printed circuit board in the first area; and flipping the printed circuit board in the second area.

Generally the apparatus and method provided by the present invention are put at the beginning end of all manufacture process. The information label, such as a bar code, may be traced anytime through the all manufacture process. The apparatus and method of the present invention, however, may be used in any segment in the manufacture process to serve different functions.

BRIEF DESCRIPTION OF THE DRAWINGS

FIG. 10 illustrates the board flipping sequence in an embodiment of the present invention.

DETAILED DESCRIPTION OF THE PREFERRED EMBODIMENT

The preferred embodiments of the present invention are illustrated hereinafter accompanying with attached drawings.

Figure 1:
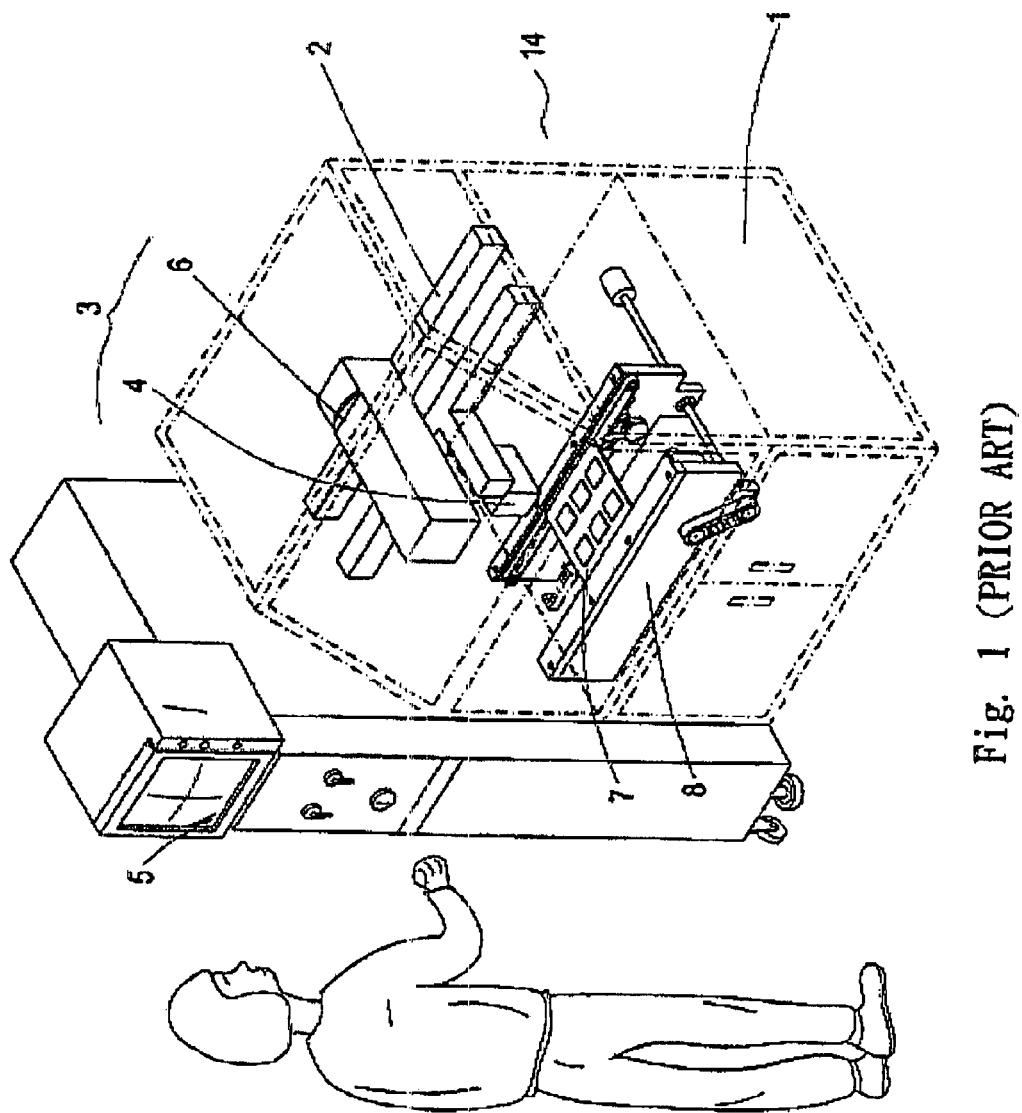
FIG. 1 is a perspective view of a relative art device.
Figure 2:
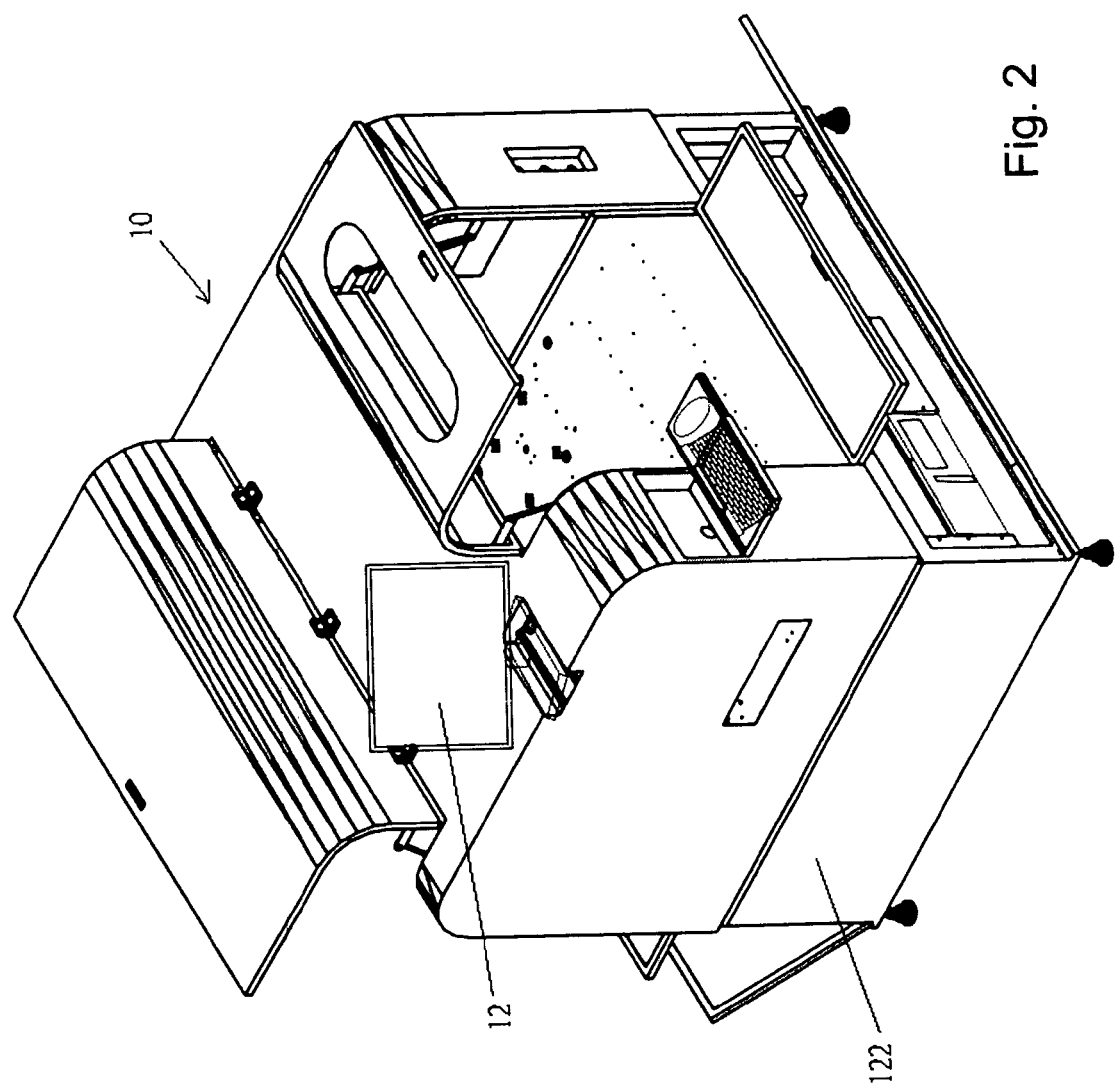
FIG. 2 is a perspective view of one embodiment of the present invention.
Figure 3:
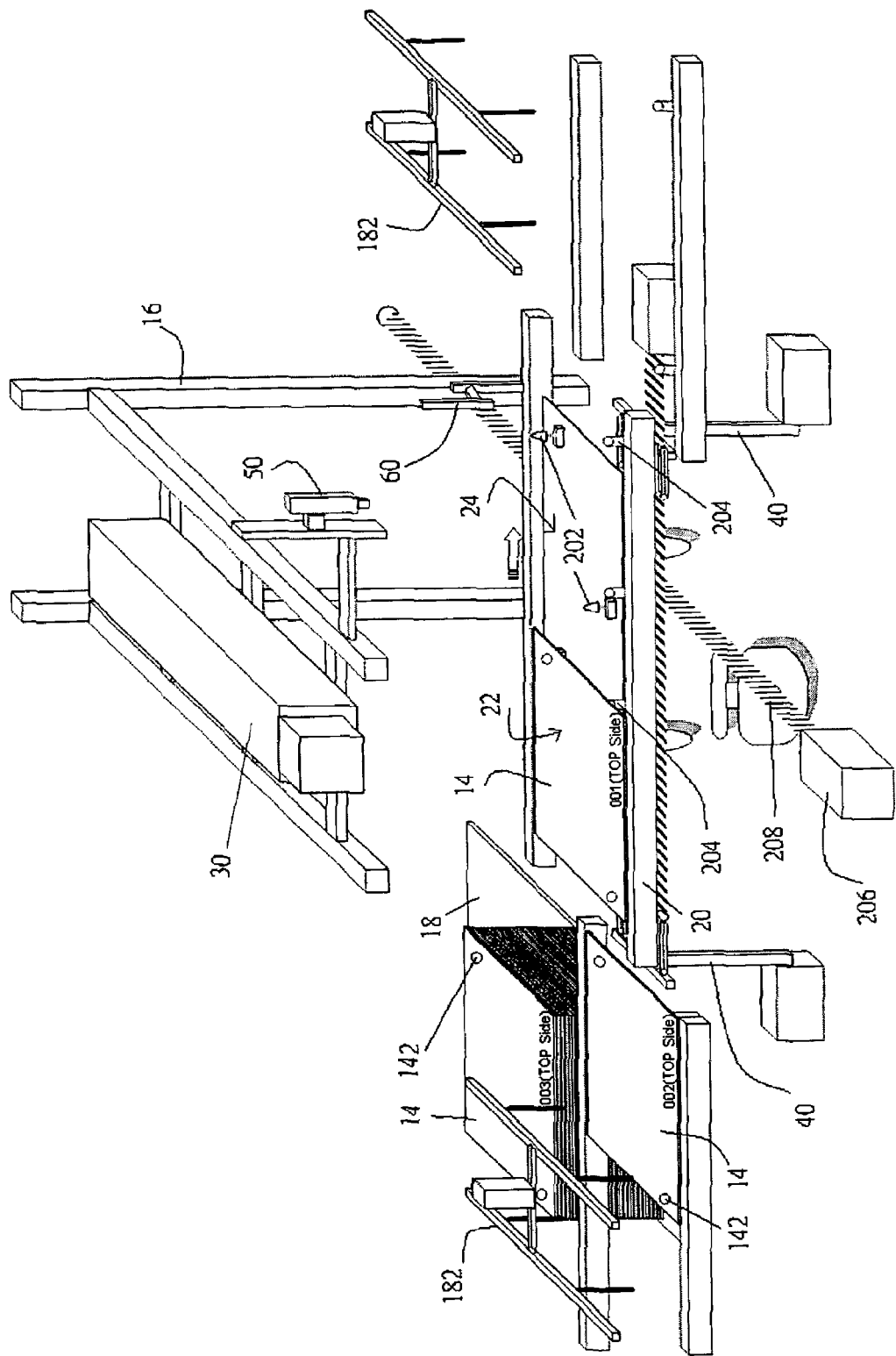
FIG. 3 shows an embodiment of conveying a printed circuit board to table.
Figure 4:
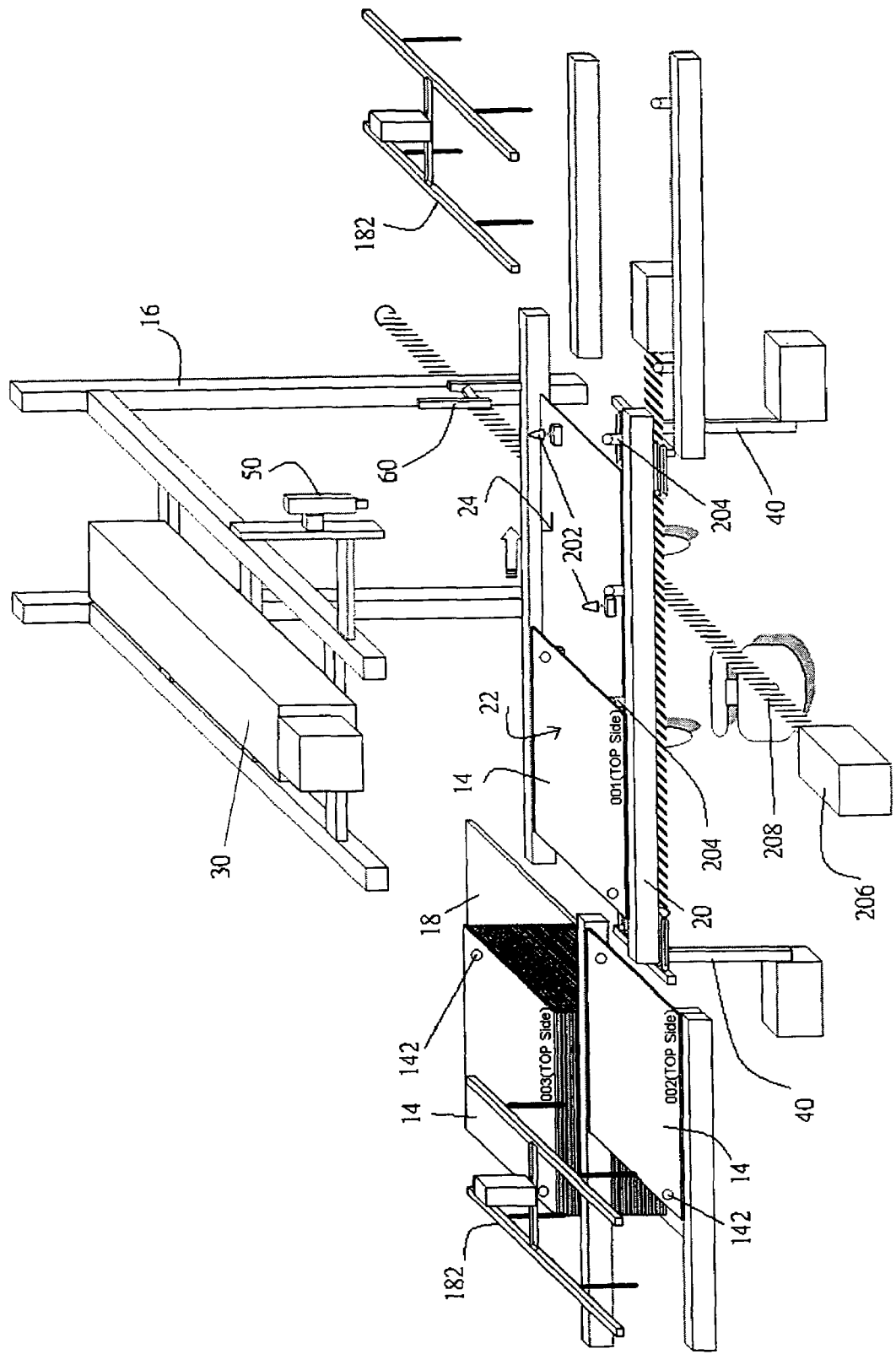
FIG. 4 shows an embodiment of labeling and reading the information label.

Please refer to FIG. 2 to FIG. 4, which show a preferred embodiment of the present invention. The present invention provides an automatically marking, reading, and distinguishing apparatus, which uses a computer 12 to programmingly control a conveyance of a plurality of printed circuit boards 14. Preferably, a controlling program written from Visual Basic, C++, PLC, other similar programming language or the combination thereof is used to control this conveyance. The apparatus 10 further includes a base 122 and a board supplier 18. The main structure of the apparatus 10 includes a table 20, an information label generator 30, at least one flipping device 40, and an image reading and distinguishing device 50. The table 20 includes a first area 22 and a second area 24. The information label generator 30 is disposed corresponding to the first area 22. In this embodiment, the information label generator 30 is disposed on a cantilever 16 above the base 122 or a position beneath the table 20. The information label generator 30 generates an information label 32 on a printed circuit board 14 in the first area 22.

Figure 7:
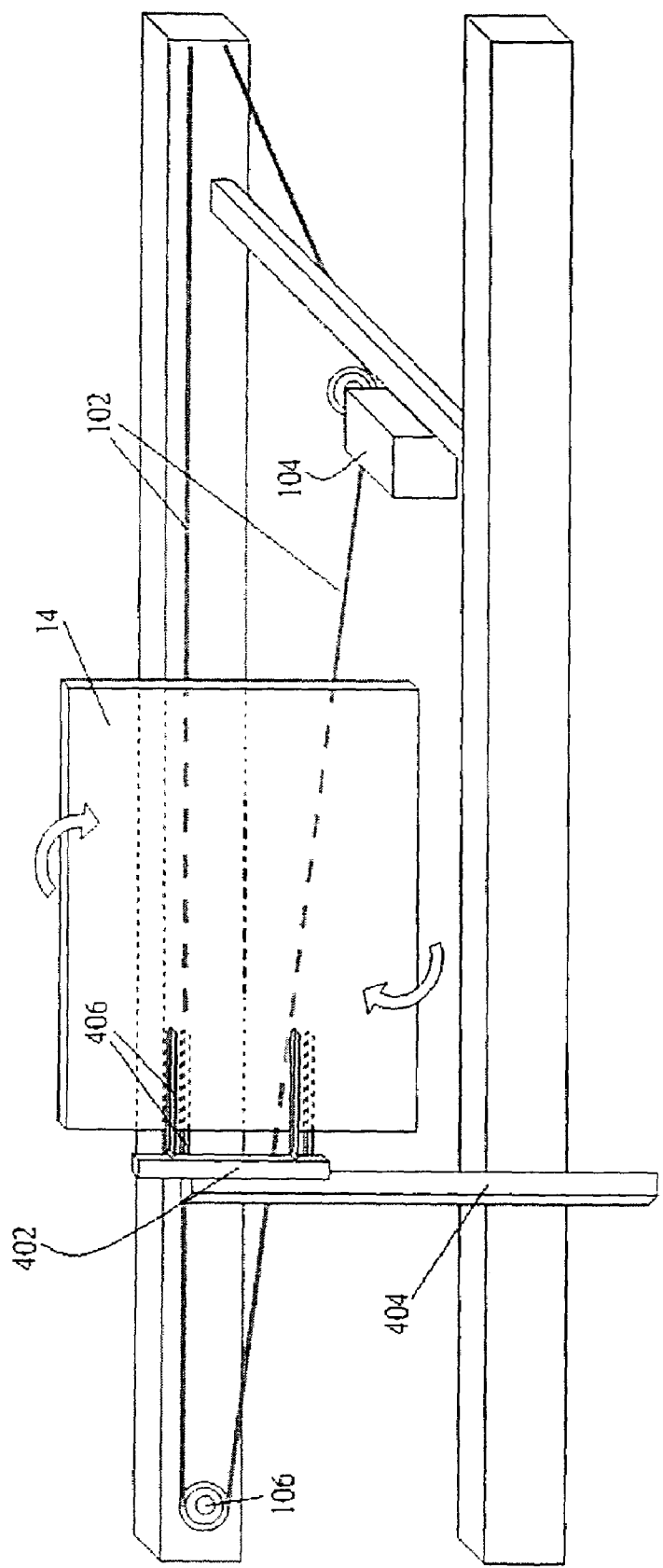
FIG. 7 shows an embodiment of the flipping device.

The flipping device 40 is under the table 20. The flipping device 40 has a rotating part 402 and at least one set of jigs 406. The set of jigs 406 are disposed on opposite sides of the rotating part 402. The set of jigs 406 include plastic members or other skidproof devices for gripping the printed circuit board 14 and preventing from falling. In a preferred embodiment, the apparatus 10 includes two flipping device 40. Referring to FIG. 7, the flipping device 40 controls the rotating part 402 to rotate 180 degree by using a motor or a set of cylinder and piston rod 404. Detailed flipping process will be disclosed later. The image reading and distinguishing device 50 is disposed corresponding to the second area 24 for reading and distinguishing the information label 32 on the printed circuit board 14 in the second area 24. Preferably, the image reading and distinguishing device 50 includes a charge coupled device (CCD). The image reading and distinguishing device 50 is preferably disposed on the cantilever 16 or beneath the table 20.

Figure 6:
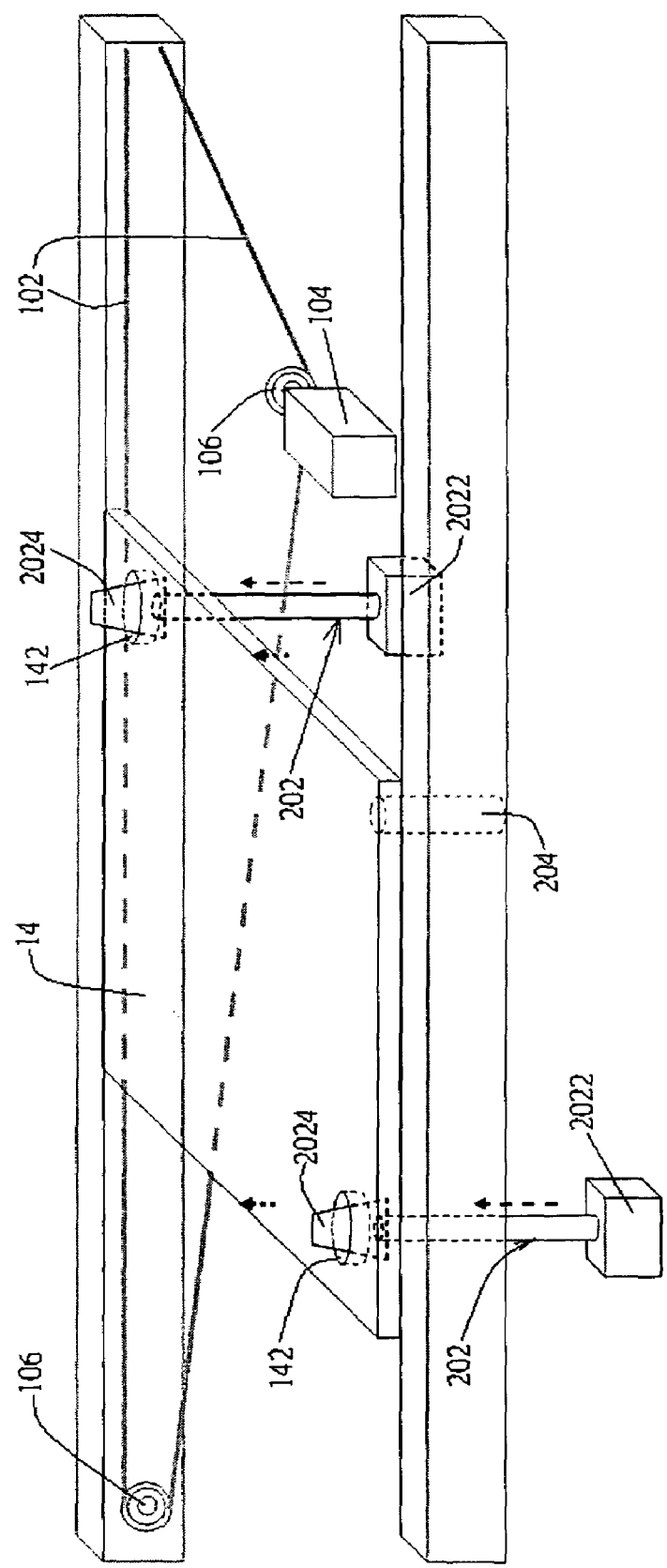
FIG. 6 shows an embodiment of the X-Y 2D movable flatbed.

Particularly, the information label generator 30 may include a laser bar code labeling device or a jet printing bar code labeling device. In FIG. 3, sensors 204 located in predetermined positions detect whether the printed circuit board 14 enters into a particular area when the printed circuit board 14 is conveyed to a X-Y 2-D movable flatbed of the table 20. According to the detection result, computer 12 enables a belt to drive the printed circuit board 14 and proceeds to the next step. Supporting members 202 support and position the printed circuit board 14 through two holes 142 diagonally formed on the printed circuit board 14. The relative elevation of the printed circuit board 14 may be adjusted by moving the supporting member 202 or the flatbed. The flatbed also includes a driving device for controlling a X-Y 2D movement of the flatbed. Preferably the driving device includes a combination of a motor 206 and a threaded guidance rod 208 to control the movement. FIG. 6 shows an embodiment of the flatbed of the present invention. A conveying device shown in this embodiment conveys printed circuit board 14 by using a combination of a belt 102, bearing 106, and a motor 104. Computer 12 controls the conveyance process. A positioning member rises and blocks the printed circuit board 14 when the sensor 204 detects that the printed circuit board 14 exists in the first area 22. Two supporting members also rise and cooperate with the positioning member to position the printed circuit board 14. Similar printed circuit board 14 positioning method is used in the second area 24. In addition, the supporting member 202 includes a combination of a cylinder 2022 and a piston rod 2024, which has a cone-shaped tip.

In the preferable embodiment shown in FIG. 6 and FIG. 7. the cylinder 2022 drives the piston rod 404 to move elastically, and the set of jigs 406 on the rotating part 402 clips the printed circuit board 14 respectively and then rotates the printed circuit board 14 for 180 degree toward a transporting direction of the table 20 radially, in the meantime, the piston rod 404 moves downward and the printed circuit board 14 is positioned at the same working area of the table 20, so as to flip the printed circuit board 14 and proceeds the double-side board is achieved.

Figure 5:
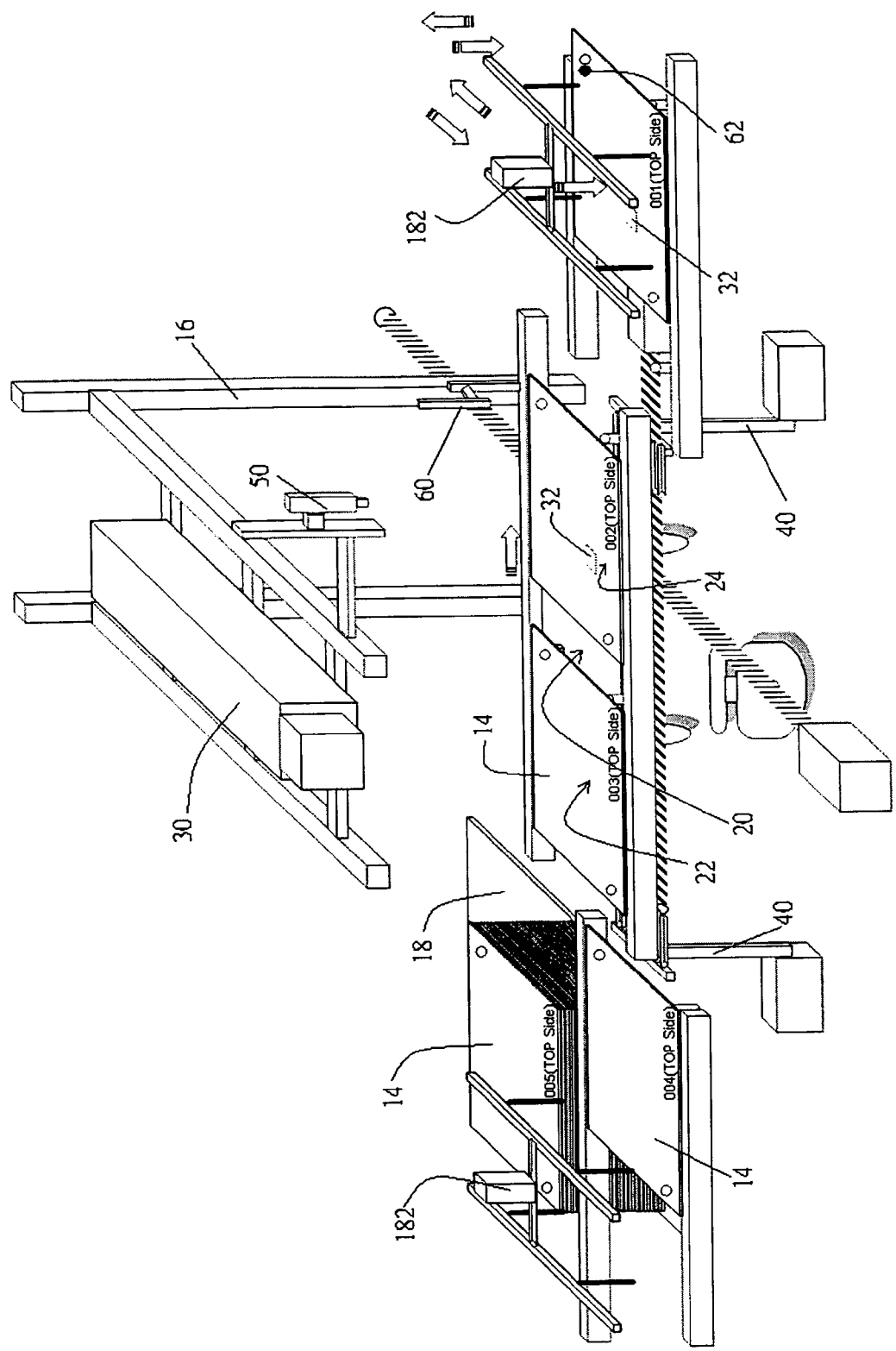
FIG. 5 shows an embodiment of retrieving the printed circuit board having undistinguishable information label.
Figure 8:
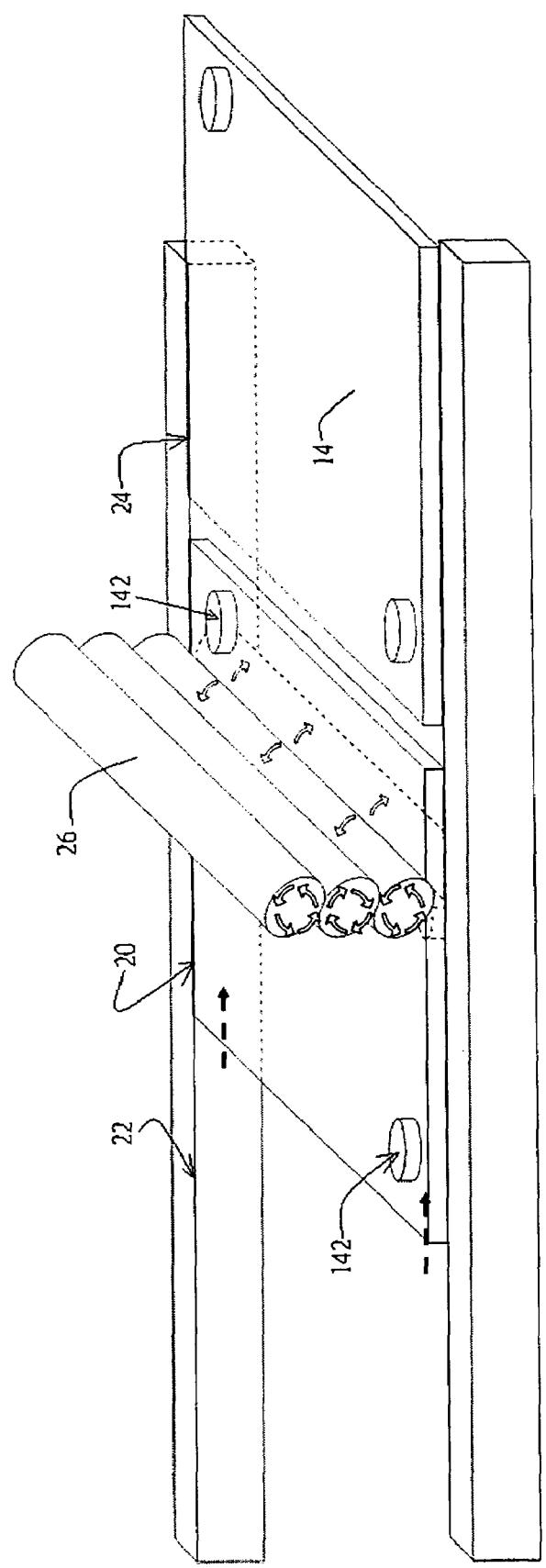
FIG. 8 shows an embodiment of the cleaning wheels.

The apparatus of the present invention further includes a marking device 60 for marking a printed circuit board 14 having an unreadable or undistinguishable information label. Referring to FIG. 5, the marking device 60 is enabled to put an undistinguishable mark 62 on the printed circuit board 14 when the image reading and distinguishing device 50 is unable to read or distinguish the information label 32. Then a vacuum board-sucking device 182 retrieves the marked printed circuit board 14 to a retrieving area, which means the printed circuit board 14 having the undistinguishable mark 62 is out from the process at this time. Referring to FIG. 8, a plurality of cleaning wheels 26 are disposed between the first area 22 and the second area 24. The sticky cleaning wheels 26 clean the information label 32 and bring stains or dirt away from the information label 32.

Figure 9:
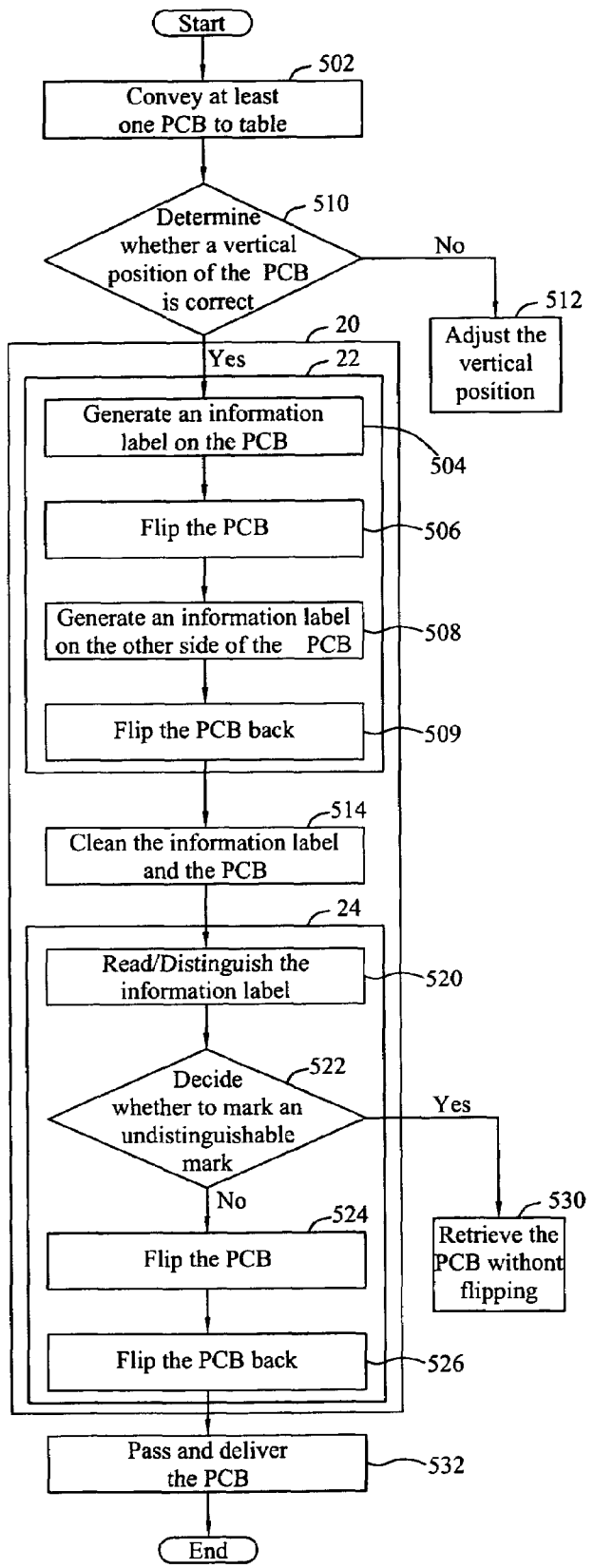
FIG. 9 is a flow chart showing an embodiment of the process of the present invention.

The present invention also provides a method for automatically marking, reading and distinguishing the printed circuit board 14. This method uses a computer 12 to proammingly control a conveyance of a printed circuit board 14. Referring to FIG. 9, step 502 conveying at least one printed circuit board to table 20. in step 510, determine whether a vertical position of the printed circuit board 14 is correct. If it is not correct, go to step 512 and adjust the vertical position of the printed circuit board 14 by adjusting the supporting members 202 or adjusting the flatbed.

In step 504, position the printed circuit board 14 in the first area 22 of the table 20 and generate an information label 32 on the printed circuit board 14. Then go to step 506, flip the printed circuit board 506. Next, in step 508, generate an information label 32 on the other side of the printed circuit board 14, and step 509, flip the printed circuit board 14 back.

In step 514, cleaning wheels clean the information label 32 and the printed circuit board 14.

In step 520, position the printed circuit board 14 in the second area 24 of the table 20 and read/distinguish the information label 32 on the printed circuit board 14. Then in step 522, decide whether to mark an undistinguishable mark on the printed circuit board 14. If not, go to step 524, flipping the printed circuit board 14. Proceed steps 520 and 524 again, reading/distinguishing the information label 32 and decide whether to mark an undistinguishable mark. If it is readable, then go to step 526, flipping the printed circuit board 14 back. Finally, in step 532, pass and deliver the printed circuit board 14.

Sensors located in predetermined position, including the first and second areas, detect whether the printed circuit board 14 enters into a corresponding area and return detection results to the computer 12. The computer 12 controls the process based on the detection results.

If the information label 32 on the first side of the printed circuit board 14 is undistinguishable and the first side is marked, the process goes to step 530, retrieves the printed circuit board without flipping. In addition, next printed circuit board is supplied to the conveying device and ready for the process when the foregoing printed circuit board is passing through the cleaning wheels.

FIG. 10 shows a preferred embodiment of flipping sequence. In step 1 to step 3, the first printed circuit board (No. 001) is labeled (L) and flipped alone in the first area. In step 3, the printed circuit board 001 is flipped from second side B back to first side A. When the printed circuit board 001 is passing through the cleaning wheels, next printed circuit board 002 is supplied and ready for processing. The printed circuit board 002 appears in the first area while the first printed circuit board 001 exists in the second area. Then the information label on side A of the printed circuit board 001 is read (R) at the time that side A of the printed circuit board 002 is labeled (L). Next, the printed circuit board 001 and the printed circuit board 002 are flipped to side B simultaneously. In next step, the information label on side B of the printed circuit board 001 is read (R) at the time that side B of the printed circuit board 002 is labeled (L). Again, the printed circuit board 001 and the printed circuit board 002 are flipped back to side A simultaneously. All sequent printed circuit boards follow the process mentioned above.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. An automatically marking, reading, and distinguishing apparatus programmingly controlling a conveyance of at least one printed circuit board, said apparatus comprising:
    a table having a first area and a second area;
    an information label generator disposed corresponding to said first area, said information label generator generating an information label on the printed circuit board in said first area;
    at least one flipping device beneath said table, said flipping device having a rotating part and at least one set of jigs, wherein said set of jigs is formed on opposite sides of said rotating part, and a piston rod is elastically connected with said rotating part to rotate said printed circuit board radially toward a transporting direction; and
    an image reading and distinguishing device disposed corresponding to said second area, said image reading and distinguishing device reading and distinguishing said information label on the printed circuit board in said second area.

2. The apparatus of claim 1, wherein said second area includes a marking device disposed by a side of said second area for marking a printed circuit board having an undistinguishable information label.

3. The apparatus of claim 2, further comprising a vacuum board-sucking device for retrieving the printed circuit board marked by said marking device.

4. The apparatus of claim 1, wherein said table includes a flatbed, said flatbed is X-Y 2-dimentionally movable.

5. The apparatus of claim 4, wherein said flatbed includes:
    a plurality of supporting members respectively disposed in each of said areas;
    a plurality positioning members respectively disposed in each of said areas; and
    a driving device for controlling a movement of said flatbed.

6. The apparatus of claim 5, wherein said driving device includes a motor and a threaded guidance rod.

7. The apparatus of claim 5, wherein said supporting member includes a cylinder and a piston rod.

8. The apparatus of claim 7, wherein said piston rod is in a cone shape.

9. The apparatus of claim 1, further comprising a plurality of cleaning wheels disposed between said first area and said second area.

10. The apparatus of claim 1, wherein said piston rod is driven by a cylinder.

11. The apparatus of claim 1, further comprising a sensor for detecting an entering of said printed circuit board.

12. The apparatus of claim 1, wherein said information label generator includes a laser bar code labeling device.

13. The apparatus of claim 1, wherein said information label generator includes a jetting/printing bar code labeling device.

14. A method for automatically marking and distinguishing a printed circuit board, comprising:
    conveying at least one printed circuit board to a table;
    positioning said printed circuit board in a first area of said table and generating an information label on said printed circuit board;
    flipping said printed circuit board radially toward a transporting direction in said first area;
    positioning said printed circuit board in a second area of said table and reading and distinguishing said information label on said printed circuit board; and
    flipping said printed circuit board radially toward a transporting direction in said second area.

15. The method of claim 14, further comprising marking said printed circuit board when said information label on said printed circuit board is undistinguishable.

16. The method of claim 15, further comprising retrieving said marked printed circuit board by using a vacuum board-sucking device.

17. The method of claim 14, further comprising flipping back said printed circuit board in one of said first area and said second area.

18. The method of claim 14, wherein said printed circuit board in said first area and a printed circuit board in said second area are flipped simultaneously.

19. The method of claim 14, further comprising cleaning said information label by using a plurality of cleaning wheels disposed between said first area and said second area.

20. The method of claim 14, further comprising detecting an entering of said printed circuit board in said first area and in sail second area.

* * * * *